United States Patent
Zhou

(10) Patent No.: US 10,566,580 B2
(45) Date of Patent: Feb. 18, 2020

(54) OLED AND METHOD FOR MANUFACTURING OLED

(71) Applicant: Shenzhen China Star Optoelectronics Technology Co., Ltd., Shenzhen, Guangdong (CN)

(72) Inventor: Kaifeng Zhou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/558,727

(22) PCT Filed: Jul. 26, 2017

(86) PCT No.: PCT/CN2017/094552
§ 371 (c)(1),
(2) Date: Sep. 15, 2017

(87) PCT Pub. No.: WO2018/218770
PCT Pub. Date: Dec. 6, 2018

(65) Prior Publication Data
US 2018/0351136 A1    Dec. 6, 2018

(30) Foreign Application Priority Data

Jun. 1, 2017  (CN) .......................... 2017 1 0404967

(51) Int. Cl.
*H01L 51/52* (2006.01)
*H01L 51/00* (2006.01)
*H01L 51/56* (2006.01)
*H01L 51/50* (2006.01)

(52) U.S. Cl.
CPC ...... *H01L 51/5293* (2013.01); *H01L 51/0014* (2013.01); *H01L 51/0015* (2013.01); *H01L 51/56* (2013.01); *H01L 51/5012* (2013.01); *H01L 2251/105* (2013.01); *H01L 2251/558* (2013.01)

(58) Field of Classification Search
None
See application file for complete search history.

(56) References Cited

U.S. PATENT DOCUMENTS

2010/0089443 A1* 4/2010 Bloomstein ......... H01L 51/0096
  136/255
2014/0261675 A1 9/2014 Loo

FOREIGN PATENT DOCUMENTS

| CN | 101222026 A | 7/2008 |
| CN | 103380506 A | 10/2013 |
| CN | 103681318 A | 3/2014 |
| CN | 104966789 A | 10/2015 |
| CN | 105244447 A | 1/2016 |
| CN | 105556681 A | 5/2016 |
| CN | 106025028 A | 10/2016 |
| CN | 106783964 A | 5/2017 |
| TW | I228943 B | 3/2005 |

* cited by examiner

Primary Examiner — Michelle Mandala
(74) Attorney, Agent, or Firm — Andrew C. Cheng

(57) ABSTRACT

An OLED is provided that includes a substrate; and an anode, a P-type organic semiconductor layer, an N-type organic semiconductor layer, and a cathode that are successively laminated on the substrate. An interface between the P-type organic semiconductor layer and the N-type organic semiconductor layer is a curved surface structure.

17 Claims, 2 Drawing Sheets

OLED AND METHOD FOR MANUFACTURING OLED

CROSS REFERENCE TO RELATED APPLICATIONS

This application claims the benefit of the priority of Chinese application No. 201710404967.X, filed on Jun. 1, 2017, and entitled "OLED AND METHOD FOR MANUFACTURING OLED", which disclosure is hereby incorporated herein by reference.

TECHNICAL FIELD

The present disclosure relates to organic optoelectronic materials, and more particularly to an organic light emitting diode (OLED), and a method for manufacturing an OLED.

BACKGROUND

In current lighting and display field, an organic light emitting diode (OLED) (also known as organic optoelectronic display), featuring a low starting voltage, thinness, lightweight, self-luminous, etc., has by virtue of these received increasing and extensive study for development of the lighting products and the panel industry to meet the demands for low energy consumption, thinness, lightweight, and surface light source.

To reduce the production cost, it is usually required that the raw materials not contain rare or precious metals. As such, the full-organic-material based OLED technology has been favored in recent years. TADF (thermally activated delayed fluorescence)-based OLED has achieved the external quantum efficiency compared to phosphorescent organic light-emitting diodes. Manufacture of such type of devices, however, often requires relatively complex multi-layer device structures and doping processes, which is not conducive to the reduction of manufacturing costs.

SUMMARY

It is an object of the present disclosure to provide an OLED which can ensure the luminous efficacy while being low in cost and simple in structure.

The OLED according to the disclosure includes a substrate, and an anode, a P-type organic semiconductor layer, an N-type organic semiconductor layer, and a cathode that are successively laminated on the substrate. The interface between the P-type organic semiconductor layer and the N-type organic semiconductor layer may be a curved surface structure.

The curved surface structure may have a thickness of 10 to 100 nm in a direction perpendicular to the substrate.

The P-type organic semiconductor layer and the N-type organic semiconductor layer may be a monolayer or multilayer, in other words, single-layer structure or multi-layer structure.

The surface of the P-type organic semiconductor layer coupled to the N-type organic semiconductor layer may be a first curved surface, while the surface of the N-type organic semiconductor layer coupled to the P-type organic semiconductor layer may be a second curved surface, where the first curved surface and the second curved surface may be opposed to and fitted with each other to form the curved surface structure.

An emission spectrum of the OLED may be derived from a PN heterojunction formed by the P-type organic semiconductor layer and the N-type organic semiconductor layer.

The first curved surface may have a cross section of one of a wavy shape, a zigzag shape, and a rectangular-teeth shape.

The method of manufacturing an OLED according to the disclosure includes the follows.

A P-type organic semiconductor layer is formed on an anode surface of a substrate.

A surface of the P-type organic semiconductor layer is processed to form a curved surface.

A N-type organic semiconductor layer is formed on the curved surface of the P-type organic semiconductor layer, an interface between the N-type organic semiconductor layer and the P-type organic semiconductor layer is a curved surface structure.

A cathode is formed on the N-type organic semiconductor layer.

In the step that the surface of the P-type organic semiconductor layer is processed to form the curved surface, the curved surface may be formed by embossing.

In the step that the N-type organic semiconductor layer is formed on the curved surface of the P-type organic semiconductor layer, the N-type organic semiconductor layer may be formed on the curved surface of the P-type organic semiconductor layer by a vapor deposition or a solution method, the surface of the N-type organic semiconductor layer in contact with the curved surface is a curved surface fitting the curved surface of the P-type organic semiconductor layer.

In the step that the surface of the P-type organic semiconductor layer is processed to form the curved surface, a vapor deposition or a solution method may be used to form the P-type organic semiconductor layer with a thickness of 20 to 100 nm.

According to the disclosure, with a interface A between the OLED's P-type organic semiconductor layer and N-type organic semiconductor layer being a curved surface, the area of interface A between the P-type organic semiconductor layer and the N-type organic semiconductor layer can be greatly enlarged, thereby increasing the probability and quantity of excitons being formed and so significantly increasing the luminous quantum efficiency of OLED devices.

BRIEF DESCRIPTION OF THE DRAWINGS

In order to better illustrate the technical solutions embodied by the embodiments of the disclosure or by the prior art, the accompanying drawings for use in description of the embodiments or the prior art are briefly described below. It will be apparent that the drawings described in the following represent merely some embodiments of the disclosure, and that those of ordinary skill in the art will be able to obtain other drawings from these drawings without performing any creative work.

DETAILED DESCRIPTION OF ILLUSTRATED EMBODIMENTS

Hereinafter, technical solutions embodied by the embodiments of the disclosure will be described in a clear and comprehensive manner in reference to the accompanying drawings intended for the embodiments. It is evident that the embodiments described herein constitute merely some rather than all of the embodiments of the disclosure, and that those of ordinary skill in the art will be able to derive other embodiments based on these embodiments without making inventive efforts, which all such derived embodiment shall all fall in the protection scope of the disclosure.

Figure 1:
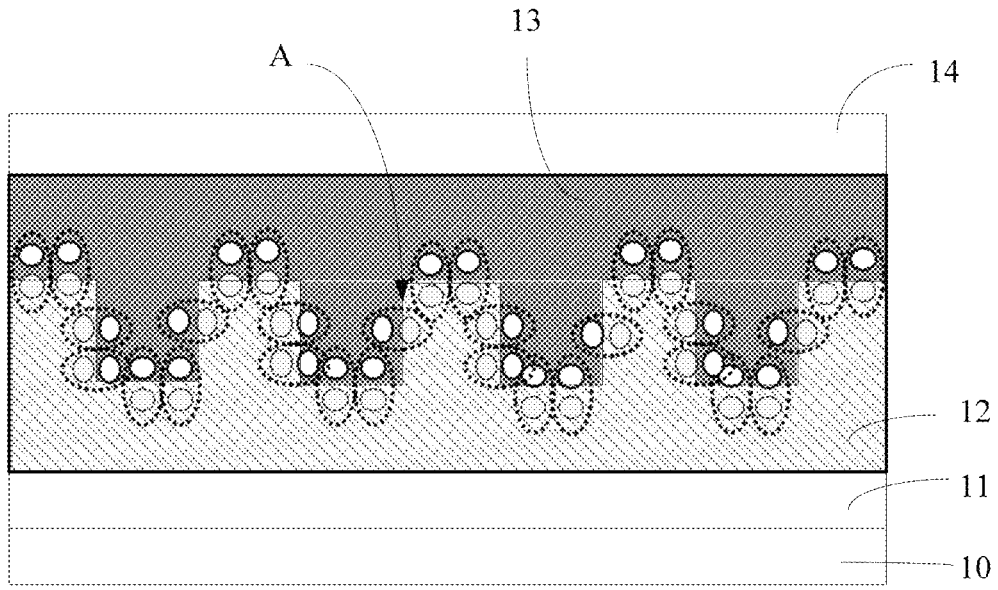
FIG. 1 is a side view of an OLED in accordance with an embodiment of the disclosure.

Referring to FIG. 1, an exemplary embodiment of the disclosure provides an OLED for use in a light-emitting device of a display. The OLED may comprise a substrate 10, and an anode 11, a P-type organic semiconductor layer 12, an N-type organic semiconductor layer 13, and a cathode 14 that are successively laminated on the substrate 10. Interface A between the P-type organic semiconductor layer 12 and N-type organic semiconductor layer 13 may be a curved surface structure. An emission spectrum of the OLED may be derived from a PN heterojunction formed by P-type organic semiconductor layer 12 and N-type organic semiconductor layer 13. The P-type organic semiconductor layer may be formed from a P-type hole transport material. The N-type organic semiconductor layer may be formed by an N-type electron transport material.

P-type organic semiconductor layer 12 and N-type organic semiconductor layer 13 may be formed by diffusion onto the same semiconductor (usually silicon or germanium) substrate 10, and a space charge region (also called a PN junction) may be formed at the interface A. After the P-type organic semiconductor and the N-type organic semiconductor are combined, in the N-type region free electrons are the majority carriers while the holes are almost none, while in the P-type region the holes are the majority carriers, leading to respective concentration differences of electrons and holes at interface A. Because of the concentration differences of free electrons and holes, some electrons will diffuse from the N-type region to the P-type region, while some holes will diffuse from the P-type region to the N-type region. Consequently, the P region side will lose the holes while leaving negatively charged impurity ions, while the N region will lose electrons while leaving positively charged impurity ions. Because ions cannot move freely in an open circuit, they do not participate in conduction. These immobile charged ions thus will form a space charge region in proximity of interface A of the P region and the N region. After the space charge region is formed, an internal electric field would be produced in the space charge region due to the interaction between the positive and negative charges, with the direction of the electric field pointing from the positively charged N region to the negatively charged P region. Therefore, the internal electric field may have an orientation opposite to that of the carrier diffusion motion and so will inhibit diffusion. Eventually, the diffusion of the majority carriers and the drift of the minority carriers will result in a dynamic equilibrium. On either side of the bonding interface of the P-type semiconductor and N-type semiconductor, a thin ionic layer would be created. The space charge region formed by such ionic thin layers is called a PN junction, hence the formation of a light-emitting core. This feature has been used by many devices in the electronic technology, such as the organic semiconductor diode of this disclosure, or it can also be used for bipolar transistors.

Interface A between P-type organic semiconductor layer 12 and N-type organic semiconductor layer 13 is actually where the surface of P-type organic semiconductor layer 12 comes into contact with the surface of N-type organic semiconductor layer 13. Interface A can also be called an interlocking structure. The curved surface structure may be one of a wavy shape, a zigzag shape, and a rectangular-teeth shape, which is governed by the surface shape of P-type organic semiconductor layer 12 that faces toward N-type organic semiconductor layer 13. The curved surface structure may have a thickness of 10 to 100 nm in the direction perpendicular to substrate 11, which may be smaller than the total thicknesses of P-type organic semiconductor layer 12 that faces toward N-type organic semiconductor layer 13. With interface A between P-type organic semiconductor layer 12 and N-type organic semiconductor layer 13 being a curved surface, the area of interface A between P-type organic semiconductor layer 12 and N-type organic semiconductor layer 13 can be greatly enlarged, thereby increasing the probability and quantity of excitons being formed and so significantly increasing the luminous quantum efficiency of OLED devices.

Figure 4:
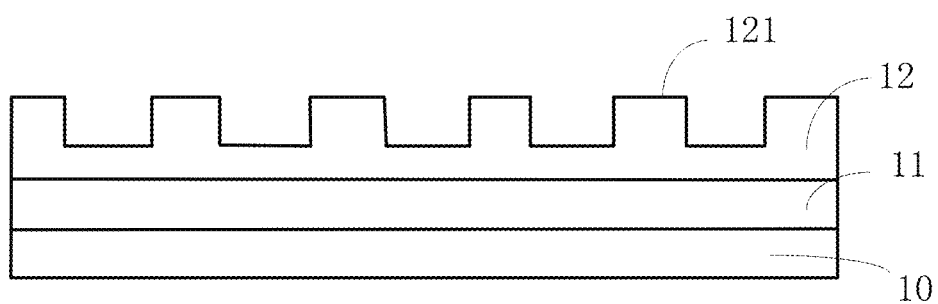
Figure 5:
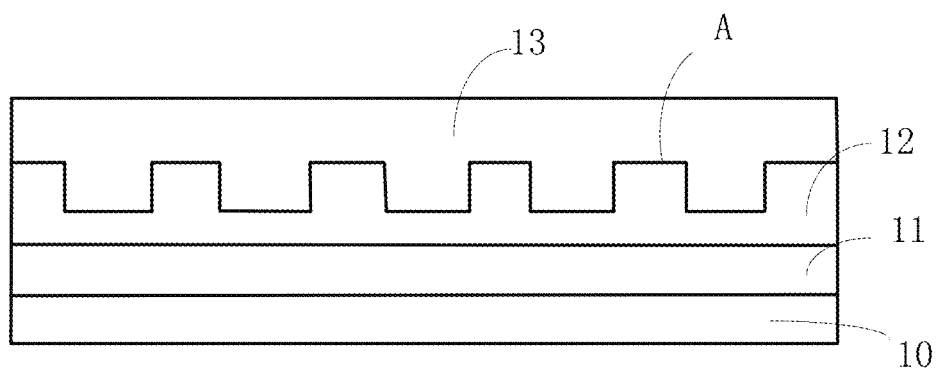

Referring to FIG. 4, in particular, the surface of P-type organic semiconductor layer 12 that joins N-type organic semiconductor layer 13 may be a first curved surface 121, while the surface of N-type organic semiconductor layer 13 that joins P-type organic semiconductor layer 12 may be a second curved surface (not illustrated). First curved surface 121 and second curved surface may be opposed to and fit with each other to form interface A of the curved surface structure. The cross section of first curved surface 121 may be one of a wavy shape, a zigzag shape, and a rectangular-teeth shape. In this embodiment the cross section of first curved surface 121 is the rectangular-teeth shape. The thickness of the curved surface structure along the direction perpendicular to substrate 11 is the height of the rectangular teeth.

The OLED according to the disclosure is provided with a curved surface structure (that is, interface A) at which P-type organic semiconductor layer 12 interfaces with N-type organic semiconductor layer 13, so the area of interface A where p-type organic semiconductor layer 12 and N-type organic semiconductor layer 13 comes into contact can be enlarged, thereby increasing the probability and quantity of excitons being formed and so increasing the luminous quantum efficiency of OLED devices.

Figure 2:
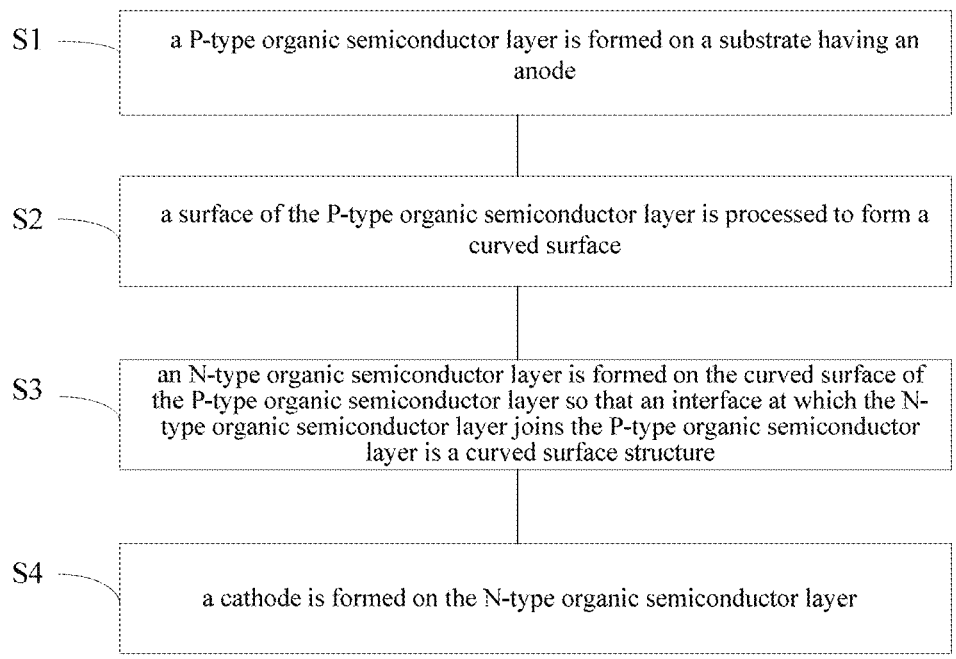
FIG. 2 is a flowchart of a method for manufacturing an OLED in accordance with an embodiment of the disclosure.

Referring back to FIG. 2, a method for manufacturing an OLED is provided according to an embodiment of the disclosure. The method can be used to manufacture the OLED described above and may comprise the following operations.

Figure 3:
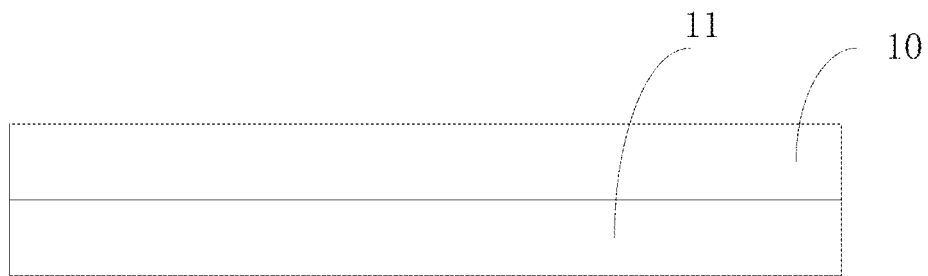
FIG. 3 through FIG. 5 are schematic views of various steps of a method of manufacturing an OLED in accordance with an embodiment of the disclosure.

At S1, referring also to FIGS. 3 and 4, a P-type organic semiconductor layer 12 may be formed on an upper surface of a substrate 10 with an anode 11; the p-type organic semiconductor layer 12 is actually formed on the anode 11. In this embodiment, a vapor deposition or a solution method may be used to form the P-type organic semiconductor layer with a thickness of 20 to 100 nm.

At S2, the surface of P-type organic semiconductor layer 12 may be processed to form a curved surface 121. The curved surface may be formed by embossing.

At S3, an N-type organic semiconductor layer 13 may be formed on curved surface 121 of the P-type organic semiconductor layer, an interface A at which the N-type organic semiconductor layer couples with the P-type organic semiconductor layer being a curved structure.

In the step of forming the N-type organic semiconductor layer on the curved surface of the P-type organic semiconductor layer, an N-type organic semiconductor layer with a thickness of 20 to 100 nm may be formed on the curved surface of the P-type organic semiconductor layer using a vapor deposition or a solution method so that the surface of the N-type organic semiconductor layer being in contact with the curved surface is a curved surface that fits the curved surface of the P-type organic semiconductor layer.

At S4, a cathode 14 may be formed on the N-type organic semiconductor layer.

While the disclosure has been described above in detail with reference to some exemplary embodiments, the scope of the disclosure is not limited thereto. It will be understood by those of ordinary skill in the art that all or part of the embodiments described above as well as the equivalent substitutes of the appended claims shall all fall in the scope of the disclosure.

What is claimed is:

1. An organic light emitting diode (OLED), comprising:
a substrate; and
an anode, a P-type organic semiconductor layer, an N-type organic semiconductor layer, and a cathode that are successively laminated on a surface of the substrate, wherein an interface between the P-type organic semiconductor layer and the N-type organic semiconductor layer is a curved surface structure that forms a light-emitting core;
wherein a surface of the P-type organic semiconductor layer contacting the N-type organic semiconductor layer is a first curved surface, and a surface of the N-type organic semiconductor layer contacting the P-type organic semiconductor layer is a second curved surface, the first curved surface and the second curved surface being opposite to and fitted with each other to form the curved surface structure; and
wherein the first curved surface with which the P-type organic semiconductor layer contacts the N-type organic semiconductor has a cross section that is rectangular-teeth shaped comprising at least one rectangular configuration comprising two opposite side surfaces that are spaced from each other and perpendicular to the surface of the P-type organic semiconductor layer and parallel to each other and an end surface that is connected between ends of the two opposite side surfaces and is spaced from and parallel to the surface of the P-type organic semiconductor layer, and wherein the second curved surface with which the N-type organic semiconductor layer contacts the P-type organic semiconductor has a cross section that is rectangular-teeth shaped and is complementary in shape to the first curved surface.

2. The OLED of claim 1, wherein the curved structure has a thickness of 10 to 100 nm in a direction perpendicular to the substrate.

3. The OLED of claim 2, wherein the P-type organic semiconductor layer and the N-type organic semiconductor layer are a monolayer or multilayer.

4. The OLED of claim 1, wherein an emission spectrum of the OLED is derived from a PN heterojunction formed by the P-type organic semiconductor layer and the N-type organic semiconductor layer.

5. The OLED of claim 1, wherein the N-type organic semiconductor layer is formed by an N-type electron transport material.

6. The OLED of claim 1, wherein the P-type organic semiconductor layer is formed from a P-type hole transport material.

7. The OLED of claim 1, wherein the curved surface structure is a interlocking structure.

8. The OLED of claim 2, wherein the thickness of the curved surface structure is less than the total thicknesses of P-type organic semiconductor layer that faces toward N-type organic semiconductor layer.

9. A method for manufacturing an organic light emitting diode (OLED), comprising:
forming a P-type organic semiconductor layer on a surface of a substrate having an anode;
processing a surface of the P-type organic semiconductor layer to form a curved surface;
forming an N-type organic semiconductor layer on the curved surface of the P-type organic semiconductor layer so that an interface between the N-type organic semiconductor layer and the P-type organic semiconductor layer is a curved surface structure that forms a light-emitting core; and
forming a cathode on the N-type organic semiconductor layer;
wherein the curved surface of the P-type organic semiconductor layer has a cross section that is rectangular-teeth shaped comprising at least one rectangular configuration comprising two opposite side surfaces that are spaced from each other and perpendicular to the surface of the P-type organic semiconductor layer and parallel to each other and an end surface that is connected between ends of the two opposite side surfaces and is spaced from and parallel to the surface of the P-type organic semiconductor layer.

10. The method of claim 9, wherein in the step of processing the surface of the P-type organic semiconductor layer to form the curved surface, the curved surface is formed by embossing.

11. The method of claim 9, wherein in the step of forming the N-type organic semiconductor layer on the curved surface of the P-type organic semiconductor layer, the N-type organic semiconductor layer is formed by a vapor deposition method or a solution method, so that the surface of the N-type organic semiconductor layer in contact with the curved surface is a curved surface that fits the curved surface of the P-type organic semiconductor layer.

12. The method of claim 9, wherein in the step of processing the surface of the P-type organic semiconductor layer to form the curved surface, the P-type organic semiconductor layer with a thickness of 20 to 100 nm is formed through a vapor deposition method or a solution method.

13. The method of claim 9, wherein the N-type organic semiconductor layer is formed by an N-type electron transport material.

14. The method of claim 9, wherein the P-type organic semiconductor layer is formed from a P-type hole transport material.

15. The method of claim 9, wherein the curved surface structure is an interlocking structure.

16. The method of claim 9, wherein the curved surface structure has a thickness of 10 to 100 nm in the direction perpendicular to the substrate.

17. The method of claim 9, wherein the thickness of the curved surface structure is less than the total thicknesses of P-type organic semiconductor layer that faces toward N-type organic semiconductor layer.

* * * * *